United States Patent [19]
Yamada et al.

[11] Patent Number: 5,148,033
[45] Date of Patent: Sep. 15, 1992

[54] ELECTRON BEAM EXPOSURE DEVICE AND EXPOSURE METHOD USING THE SAME

[75] Inventors: Akio Yamada, Kawasaki; Kiichi Sakamoto, Tokyo, both of Japan

[73] Assignee: Fujitsu Limited, Kawasaki, Japan

[21] Appl. No.: 769,343

[22] Filed: Oct. 2, 1991

Related U.S. Application Data
[63] Continuation of Ser. No. 590,798, Oct. 1, 1990, abandoned.

[30] Foreign Application Priority Data
Sep. 30, 1989 [JP] Japan ................. 1-253763

[51] Int. Cl.$^5$ .......................... H01J 37/302
[52] U.S. Cl. ................... 250/492.2; 250/398
[58] Field of Search .......... 250/492.2, 492.22, 492.23, 250/398

[56] References Cited
U.S. PATENT DOCUMENTS
4,213,053  7/1980  Pfeiffer ..................... 250/492.2
4,968,893  1/1990  Yasuda et al. ............. 250/492.2

FOREIGN PATENT DOCUMENTS
52-119185  10/1977  Japan.

OTHER PUBLICATIONS
H. C. Pfeiffer IEEE Transactions on Electron Devices vol. ED-26 No. 4, Apr., 1979, pp. 663-674.

*Primary Examiner*—Jack I. Berman
*Attorney, Agent, or Firm*—Staas & Halsey

[57] ABSTRACT

An electron beam exposure device comprises an electron gun, a mask plate provided with a plurality of apertures defining corresponding patterns, each pattern having a specific shape for forming a corresponding cross-sectional shape of an electron beam composed of charged particles incident thereon and passing therethrough, deflecting means provided both on a first side of a mask plate onto which the beam is irradiated and on a second side thereof from which the beam is emitted, for deflecting the beam from an original axis thereof so as to pass through a selected one of the apertures provided on the mask plate, and for deflecting again said beam so as to return said beam to the original axis thereof, sample holding means, focus point adjusting means provided between the mask plate and the sample holding means, and control means for controlling the focus point adjusting means. The focus point adjusting means further comprises processing means for processing focus point adjusting condition data for each specific aperture pattern utilizing a specific relationship between the cross-sectional area of the aperture of each pattern and a specific focus point adjusting value for each pattern, and supplying means for supplying information of said focus point adjusting condition data thus obtained to the focus point adjusting means.

25 Claims, 10 Drawing Sheets

Fig. 2
(PRIOR ART)
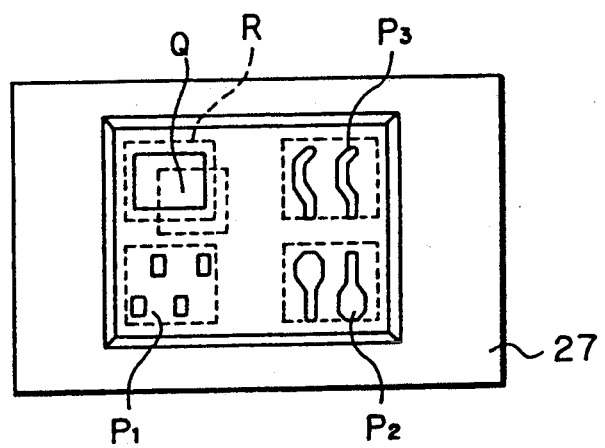
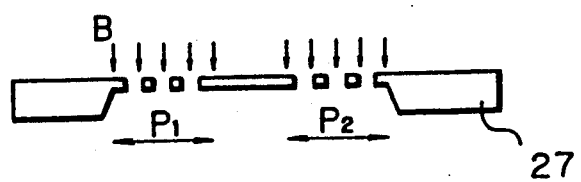

WAVEFORM OBTAINED WHEN FOCUS POINT IS NOT AT BEST FOCUS POINT

WAVEFORM OBTAINED WHEN FOCUS POINT IS AT BEST FOCUS POINT

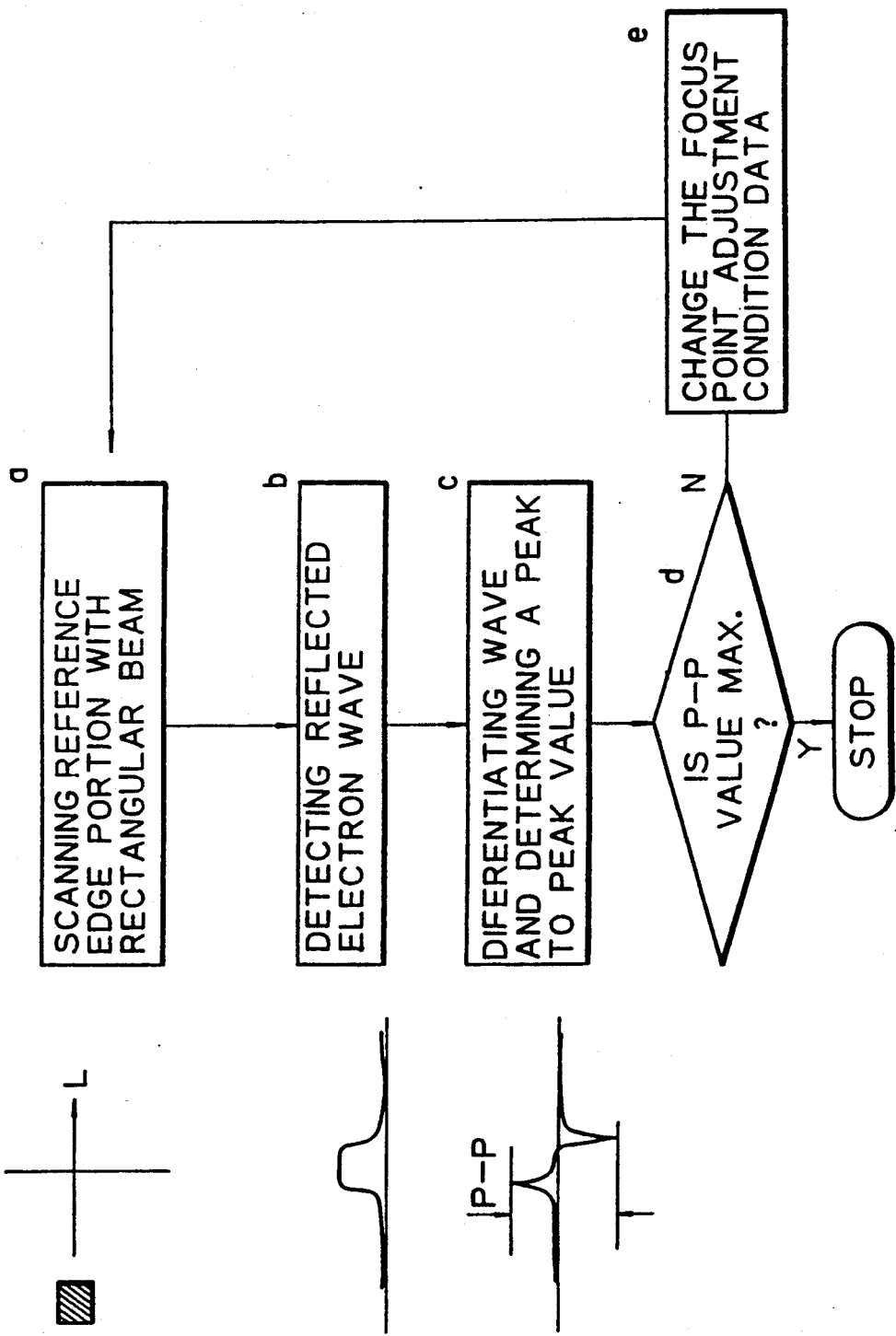

Fig. 10A

MEASURING MODE

SELECTING A CERTAIN BLOCK PATTERN $P_n$ AND MEASURING AN AMOUNT OF A CURRENT $I_n$ CAUSED BY AN ELECTRON BEAM PASSING THROUGH THE SELECTED BLOCK PATTERN $P_n$

↓

DEFLECTING THE BEAM TO AN APERTURE Q OF A VARIABLE AREA RECTANGULAR SHAPE APERTURE GENERATING MEANS BY A PATTERN CONTROL CIRCUIT AND DETERMINING THE RECTANGULAR APERTURE AREA WHICH MAKES CURRENT $I_q$ COINCIDE WITH THE CURRENT $I_n$

↓

MEASURING FOCUS POINT ADJUSTING DATA $D_n$ AND BEAM AXIS DEVIATION ADJUSTING DATA $ID_n$ UTILIZING A RECTANGULAR BEAM CORRESPONDING TO THE BEAM FORMED BY THE SELECTED PATTERN $P_n$

↓

STORING THE ADJUSTING DATA $D_n$ AND $ID_n$ IN RESPECTIVE DATA STORING REGIONS IN A MEMORY AT RESPECTIVE ADDRESSES $\#P_n$ CORRESPONDING TO THE SELECTED BLOCK PATTERNS $P_n$

Fig. 10B

EXPOSURE MODE

DESIGNATING A CERTAIN BLOCK PATTERN $P_n$ WHEN AN EXPOSURE PROCESS IS CARRIED OUT, WHEREBY AN ADDRESS NUMBER #$P_n$ IS DESIGNATED

INPUTTING THE ADDRESS NUMBER #$P_n$ INTO THE MEMORY MEANS THROUGH THE PATTERN CONTROL MEANS AND READING OUT THE ASSOCIATED ADJUSTING DATA $D_n$ AND $ID_n$ STORED IN THE MEMORY FOR THE ADDRESS PORTION #$P_n$ CORRESPONDING TO THE SELECTED BLOCK PATTERN $P_n$

APPLYING THE ASSOCIATED ADJUSTING VALUES IN THE FORM OF A CURRENT $I_n$ CORRESPONDING TO THE ADJUSTING DATA $D_n$ AND $ID_n$ TO AN ADJUSTING COIL OF THE FOCUS POINT ADJUSTING MEANS AND A DEFLECTOR OF THE BEAM AXIS DEVIATION ADJUSTING MEANS, RESPECTIVELY

IRRADIATING AN ELECTRON BEAM ONTO A SAMPLE

ELECTRON BEAM EXPOSURE DEVICE AND EXPOSURE METHOD USING THE SAME

This application is a continuation of application Ser. No. 07/590,798, filed Oct. 1, 1990, now abandoned.

BACKGROUND OF THE INVENTION

1. Field of the Invention

The present invention relates to an electron beam exposure device and an exposure method using the same in which fine patterns used for an integrated circuit are formed on a wafer utilizing a charged particle beam such as an electron beam.

2. Description of the Related Art

In the recent times, along with the production of highly integrated circuits, the photolithographic system, which had been the main fine pattern forming method for a long time, has been replaced with a new exposure method utilizing an electron beam.

The conventional exposure device utilizing a charged particle such as an electron beam forms a pattern by deflecting and scanning an electron beam having a variable rectangular cross-sectional shape on a sample wafer.

This conventional device generally has a pattern generating function and forms a pattern utilizing pattern data software.

In this device, a pattern is usually formed by assembling a plurality of exposure shots, each of rectangular configuration.

As the pattern size becomes smaller, the number of shots of the electron beam in an unit area increases.

Therefore, a problem arises in that the through-put is reduced.

In order to overcome this problem, a block exposure system has been proposed.

Generally speaking, most parts of an ultra fine pattern used in a semiconductor device such as a 64 MDRAM are formed by arranging certain basic patterns repeatedly and successively.

Therefore, if a basic pattern of a certain complexity of pattern shape, i.e., a "block", can be generated in one operation and an electron beam having a certain cross-section shot on to a wafer, a certain pattern can be exposed on a wafer with a predetermined constant through-put despite the fineness of the patterns.

To obtain the overall pattern, several basic patterns, each having a different cross-section, are provided on a mask.

The intended overall pattern is formed by exposing the basic patterns on the wafer repeatedly and combining them.

FIG. 1 shows a conventional block-exposure system.

In FIG. 1, an electron gun 3a is provided in a charged particle beam generating means 3. An electron beam emitted from the electron gun 3a is given a rectangular cross-section utilizing a plate 6.

The plate 6 has an aperture which gives the cross-section of the electron beam a first rectangular configuration.

The electron beam thus formed is deflected from a center of the beam path by an aperture selecting deflector 5 and irradiated on a selected basic pattern formed on a stencil mask 27.

The electron beam passing through the mask 27 is contracted by a contracting lens 14, and then irradiated on a wafer 25 through a projecting lens 24 and deflecting systems 21 and 23.

FIG. 2 shows one example of a conventional stencil mask 27.

As shown, a pattern forming portion has a thin portion like a thin film.

Several different kinds of basic patterns $P_1$ to $P_3$ are formed on the plate 27 utilizing an etching process.

As a mask substrate, a semiconductor such as Si or a metal plate can be used.

In this electron beam exposure device, the electron beam given the same cross-sectional configuration as a pattern on the pattern mask has a certain current value corresponding to the size of the cross-sectional configuration.

The image-forming condition for the pattern image focused on the surface of the wafer slightly changes in response to the current value measured on the surface.

Note that the size of an electron beam passing through any one of the apertures can be set by the patterns $P_1$ to $P_3$. An electron beam passing through a pattern with a large aperture area generally has a large current while an electron beam passing through a pattern with a small aperture area has only a small current.

When such an electron beam is irradiated on a wafer 25 mounted on a sample holder 26, the edge sharpness of the beam is sometimes lost due to a difference in the electron scattering effect caused by a difference of the current, between a shot utilizing a large aperture pattern and one utilizing a small aperture pattern.

Accordingly, a problem arises that sharp edges cannot be obtained.

To resolve this, it has been proposed to provide a focus adjusting coil, i.e., a refocus coil 28, between the mask plate 27 and the sample holding device 26.

In this system, however, the problem still remains as to how the focus adjusting value can be determined with respect to each of the block patterns $P_1$ to $P_3$.

That is, in the block-exposure device, when a plurality of block patterns having different aperture areas are used, since the beam size changes in accordance with the selected block pattern and thus the current, i.e., the detected electric current, passing through a surface of the sample may changed when the beam is irradiated on the wafer, the conventional system requires a focus adjusting operation utilizing a refocus coil.

In this conventional focus adjusting system, however, while the sharpness of the beam edge can be relatively easily measured with a rectangular beam since the cross-sectional configuration of the beam obtained by the variable rectangular shape generating means is rectangular and thereby the focus adjusting value can be determined in response to the beam size (current flowing through surface of sample), it is very difficult to determine the focus adjusting value since it is not easy to measure the sharpness of a block pattern where the beam cross-sectional configuration is generally complicated.

Another system can be considered in which exposure data representing aperture areas of each of plural block patterns are previously stored in a suitable data storing means, a focus adjusting value is determined from the aperture area and the current density, and the focus adjusting value thus determined is applied to a refocus coil.

In this system, however, another problem arises in that the processing circuit and process control circuit for determining the focus adjusting value, i.e., adjusting data, are very complicated.

SUMMARY OF THE INVENTION

Accordingly, the object of the present invention is to provide an electron beam exposure device and an exposure method in which the best focused image point of the exposure beam with respect to each of the block patterns to be used is formed on a surface of a sample wafer to form a sharp pattern thereof and the electron beam exposure operation is carried out effectively.

To attain the object of the present invention, there is provided an electron beam exposure device which comprises an electron gun, a mask plate provided with a plurality of apertures of patterns, each having a predetermined shape for forming a cross-sectional shape of an electron beam composed of charged particles, deflecting means provided both on a first side surface of a mask plate to which the beam is irradiated and on a second, opposite side surface thereof from which the beam is emitted, for deflecting the beam from an original axis thereof so as to pass to one of the apertures provided on the mask plate, and for deflecting again the beam so as to return to the original axis thereof, a sample holding means, a focus point adjusting means provided between the mask plate and the sample holding means, and a control means for controlling the focus point adjusting means, wherein the focus point adjusting means is further provided with a processing means for processing a focus point adjusting condition data of each pattern having a certain shaped aperture utilizing a predetermined relationship between a cross-sectional area of an aperture of each pattern and a predetermined focus point adjusting value, with respect to each of the patterns, and a supplying means for supplying information of the focus point adjusting condition data thus obtained to the focus point adjusting means.

As another aspect of the present invention, there is provided an exposure method for adjusting a focus point in an electron beam exposure device which comprises an electron gun, a mask plate provided with a plurality of apertures each having a predetermined shape for forming a cross-sectional shape of an electron beam composed of charged particles and a variable rectangular aperture forming means by which a cross-sectional area of the rectangular aperture is variably changed, deflecting means provided both on a first side of the mask plate to which the beam is radiated and on a second, opposite side of a surface thereof from which the beam is emitted, respectively for deflecting the beam from an original axis thereof so as to pass to one of the apertures of said patterns provided on the mask plate, and for deflecting it again to return to the original axis thereof, a sample holding means, current measuring means for measuring the current flowing through a surface of the sample to be exposed by the electron beam, and a focus point adjusting means including a memory means for storing control data thereof and a control means for controlling the focus point adjusting means.

The method comprising the steps of;

selecting one of the patterns, having a certain cross-sectional shape and a certain area provided on the mask plate;

irradiating a beam through the selected pattern to form an image of the selected pattern on the sample holding means;

measuring a current value representing the intensity of the beam as measured on a surface of the sample on the sample holding means with respect to the pattern image, when utilizing the pattern thus selected;

repeating the measuring step with respect to each of the apertures of the patterns and storing the current values in a memory means; and selecting a certain rectangular shaped aperture having a cross-sectional area giving the same current as that obtained when each corresponding one of the patterns is selected for measuring the amount of the current so as to make the cross-sectional area of the rectangular shaped aperture conform with that of the cross-sectional area of the pattern thus measured;

irradiating the beam through the rectangular shaped aperture thus selected so as to form an image of the pattern on said sample holding means;

determining focus point adjusting condition data to adjust a best focus point by the focus point adjusting means utilizing a discriminating means for determining whether the focus point is suitably located at the best focus point or not and, if not, processing the focus point adjusting condition data to decide the best focus point;

storing the data thus obtained in the memory means in the control means; and adjusting the focus point by operating the focus point adjusting means in response to the focus point adjusting condition data stored in the memory means.

BRIEF DESCRIPTION OF THE DRAWINGS

FIG. 2 shows one example of a mask plate used for the electron beam exposure device on which a plurality of different types of apertures for patterns are provided;

FIG. 8 is a flow chart of a method for obtaining a best focus point;

FIGS. 10A amd 10B are a flow chart for adjusting a focus point and exposing an electron beam on a sample in accordance with the present invention.

DESCRIPTION OF THE PREFERRED EMBODIMENTS

Preferred embodiments of the present invention will now be explained with reference to the attached drawings.

Figure 1:
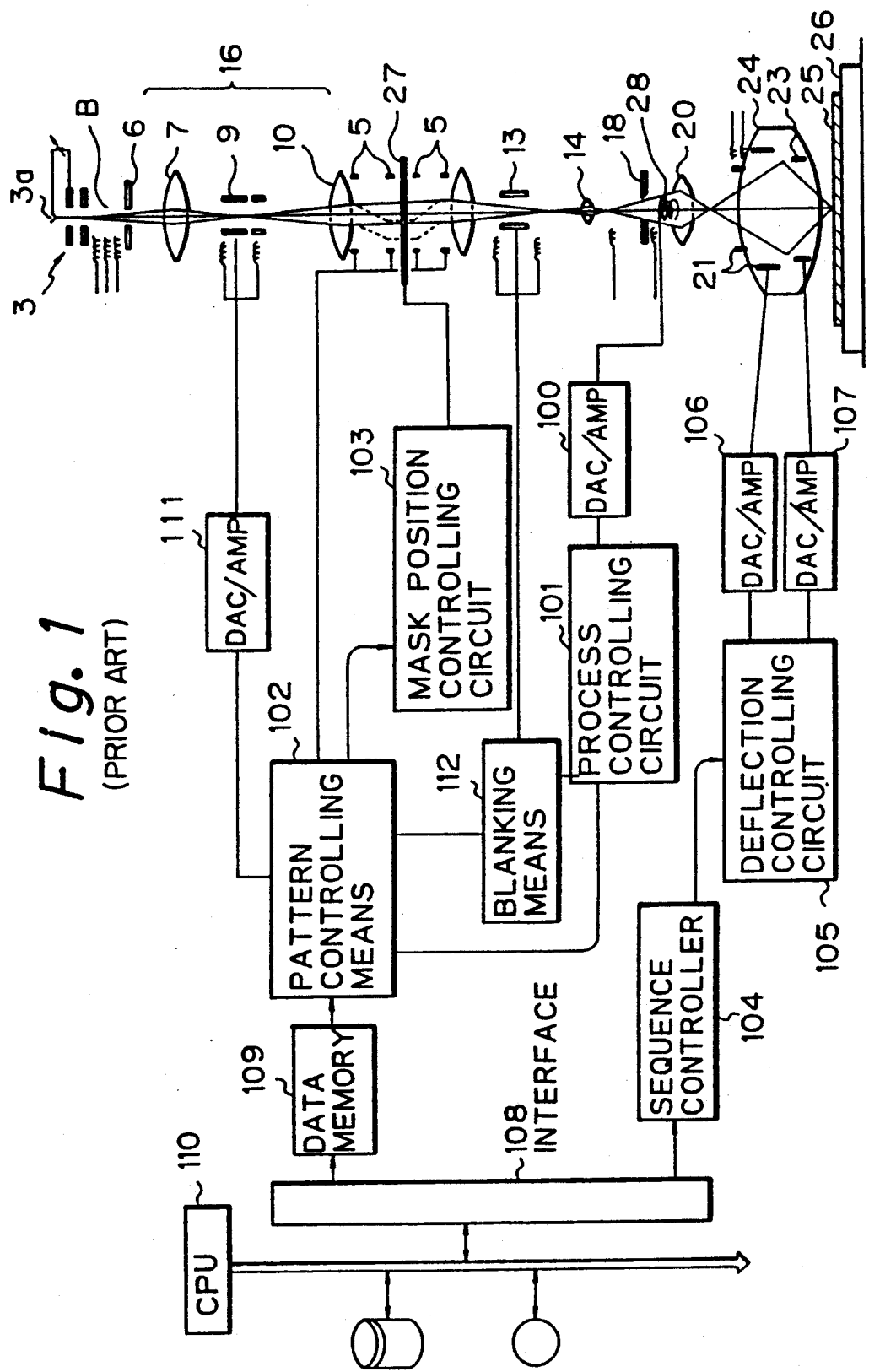
FIG. 1 shows one example of a conventional beam exposure device.
Figure 3:
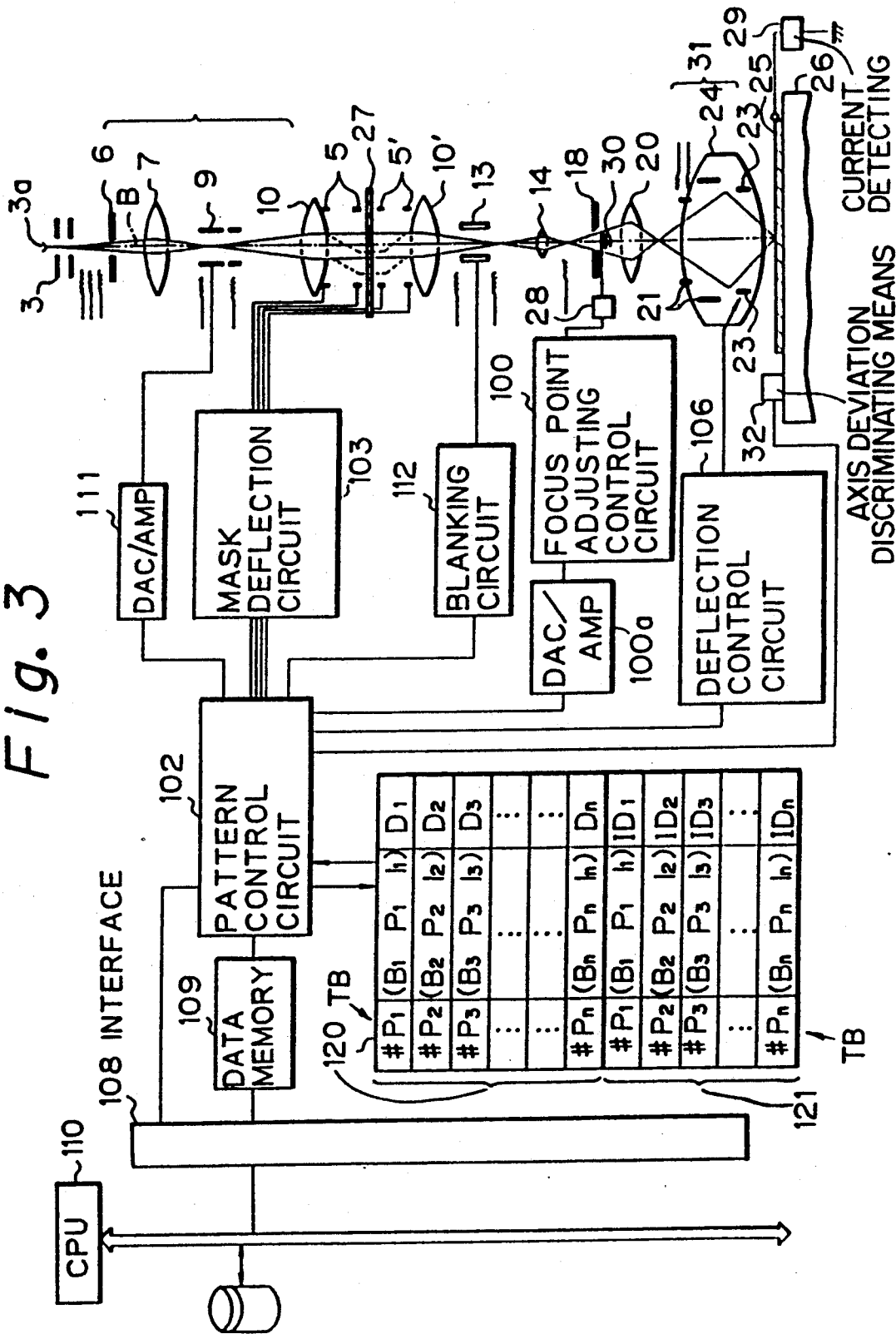
FIG. 3 is a block diagram of one example of an electron beam exposure device of the present invention.

FIG. 3 is a schematic view of one embodiment of an electron beam exposure device and a diagram of a control circuit of the present invention; the basic construction thereof is the same as the conventional one shown in FIG. 1.

An electron beam B composed of charged particles is irradiated from an electron gun 3a mounted on an electron beam generating means 3, and guided to an aperture means 6 having a rectangular cross-sectional shape to form a first rectangular shape, then irradiated onto a mask plate 27 through an optical system comprising lenses 7 and 10 and a beam deflector 9.

The electron beam B then selectively passes through one of the apertures of the block patterns $P_1$ to $P_3$, provided on the mask plate 27, to give a cross-sectional configuration the same as that of the pattern selected.

Thereafter, the electron beam is irradiated on a sample wafer 25 mounted on a sample holder 26 through an electron beam deflecting means 13, a contracting lens 14, and a focus point adjusting means 28 comprising a focus point adjusting coil 30 and a focus adjusting lens.

In this embodiment, the electron beam B is controlled to be exposed on the most suitable position of the sample by an electron beam deflecting means 31 comprising a lens 24 and deflectors 21 and 23.

The electron beam deflecting means 31 also has separate functions not only to scan the electron beam B back and forth on the surface of the sample wafer but also to adjust an electron beam axis deviation from a center axis of the device, especially of the beam deflecting means 31, to make the deviated beam axis coincide with the center axis of the device.

The mask plate 27 used in the present embodiment has the same construction as shown in FIG. 2. A plurality of patterns $P_1$ to $P_3$ having different shaped apertures are provided on the mask plate in a block condition.

Note that the pattern $P_1$ has a rectangular shaped aperture. In the present embodiment, a plurality of the patterns $P_1$ having rectangular shaped apertures may be provided on the mask plate. FIG. 2 shows four patterns $P_1$ provided on the mask plate.

In FIG. 2, a plurality of patterns $P_2$ each having a key-hole like aperture and a plurality of patterns $P_3$ each having a hook-like aperture are also provided on the mask plate.

In the present embodiment, the area of the aperture of each pattern may be different from the others even in the same pattern, if the case requires.

Moreover, in the present embodiment, there is provided a variable rectangular shape generating means R having a rectangular shaped aperture Q. The area can be changed by changing the overlap of two plates each having a rectangular aperture. These plates allow any kind of rectangular aperture having any area to be obtained.

As shown in FIG. 3, in the present embodiment, lenses 10 and 10' are provided respectively on the side of the mask plate to which the electron beam is irradiated, referred to as a first side, and on the opposite side of the mask plate from which the beam is emitted, referred to as a second side. Further, there is provided a beam deflecting means 5 between the lens 10 and the mask plate 27, which deflects the incident electron beam B from a center axis of the device to pass through a selected necessary pattern provided on the mask plate 27. There is also provided a beam deflecting means 5' between the lens 10, and the mask plate 27 which deflects the deflected electron beam passed through the selected aperture of the pattern back to the original center axis of the device.

The focus adjusting means 28 may comprise a focus adjusting lens 20 and a focus adjusting coil 30. It is important that the center axis of the focus adjusting means 28 coincide with the axis of the electron beam B.

From the practical point of view, it is generally difficult to make all axes of the focus adjusting means 28, the focus adjusting lens 20, and the focus adjusting coil 30 coincide with each other, so there is naturally a slight deviation between the axis of the electron beam and the center axis of this device.

Figure 4:
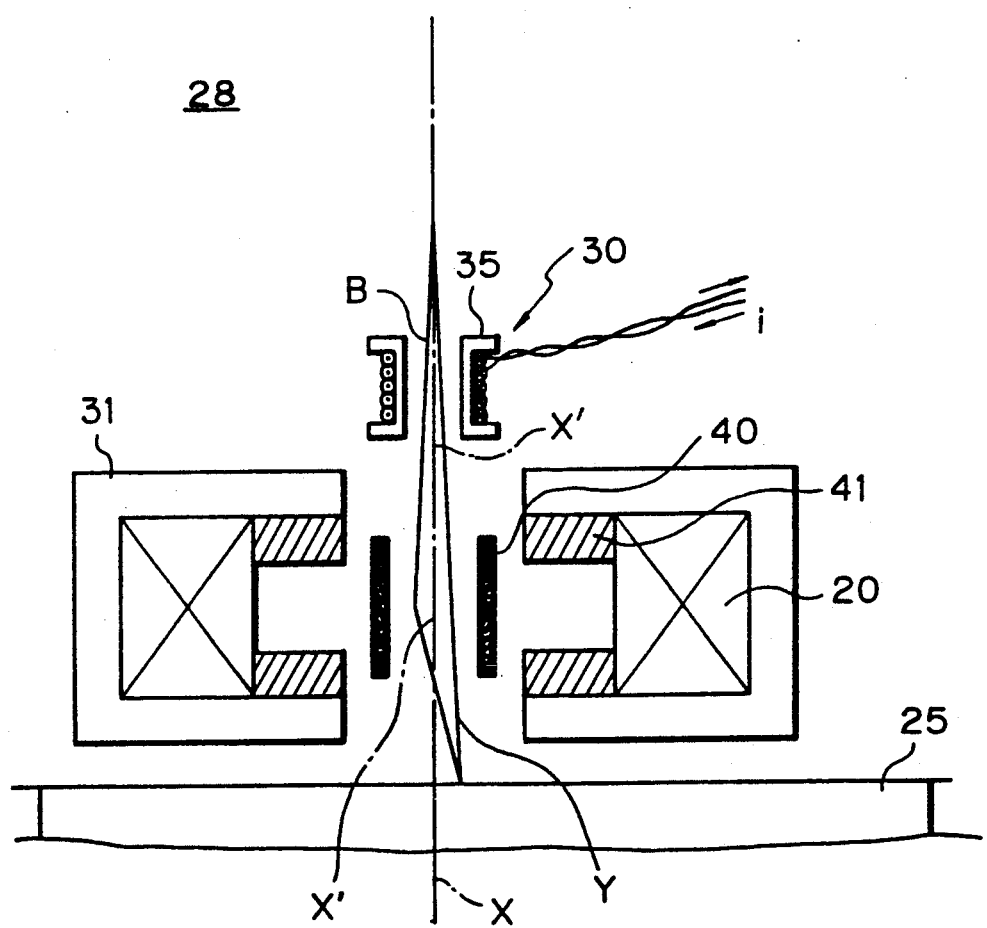
FIG. 4 is an enlarged cross-sectional view of one example of a focus point adjusting means of the present invention.

FIG. 4 is a cross-sectional view of a device including a focus adjusting means 28 and a beam deflecting means 31 serving as a beam axis deviation adjusting means. The focus adjusting means 28 comprises a spool 35 on which a focus adjusting coil 30 through which an adjusting current i flows is provided. The beam deflecting means 31 comprises a deflector 40, magnetic plate 41, and a coil for focusing lens 20.

In this device, as explained above, the center axis X' of the focus adjusting means 28 does not usually coincide with the axis Y of the electron beam B. Thus, the deviation should be adjusted utilizing the beam deflecting means 31.

On the other hand, when the focus adjusting means 28 is operated to adjust the focus point to coincide with the best focus point, the beam axis is usually deviated from the center axis of the device and accordingly an operation for adjusting the deviation is again required.

In the present embodiment, there is provided a control means comprising a circuit for controlling current to adjust a focus point in response to focus adjusting condition data generated from a pattern control means 102 connected to memories 120 and 121. These memories 120 and 121 store focus adjusting condition data and beam axis deviation adjusting data therein, respectively.

In the present embodiment, a current detecting means 29 is provided on the sample holding means 26. This converts the intensity of the electron beam B striking the sample wafer 25 and the amount of charge into a current (sample current) for measurement.

Further, there is provided a discriminating means 32 for determining whether the present focus point is set at a best focus point and whether the electron beam is deviated from the center axis of the device. This reports the results of the operation to the focus adjusting means or the beam axis deviation adjusting means.

Figure 5A:
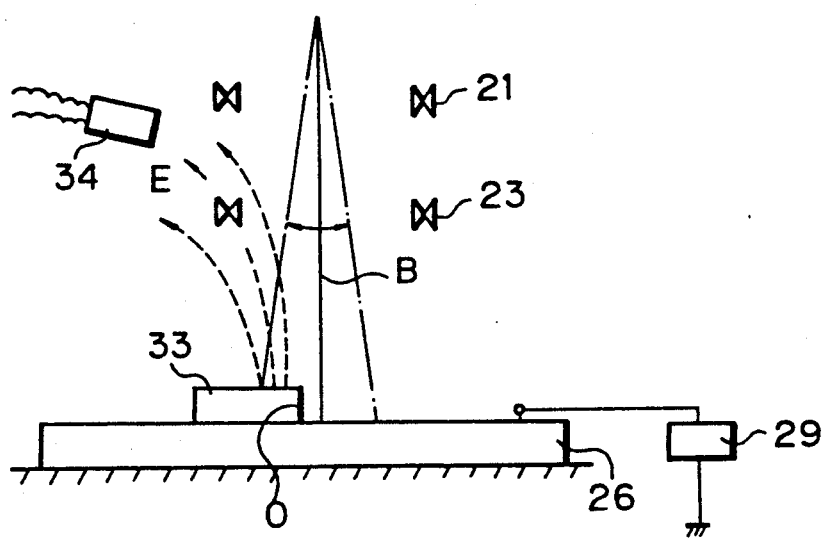
FIGS. 5A, 5B, 6, 7A, and 7B illustrate a process for determining a best focus point and a beam axis deviation apart from a center axis of a deflector.
Figure 5B:
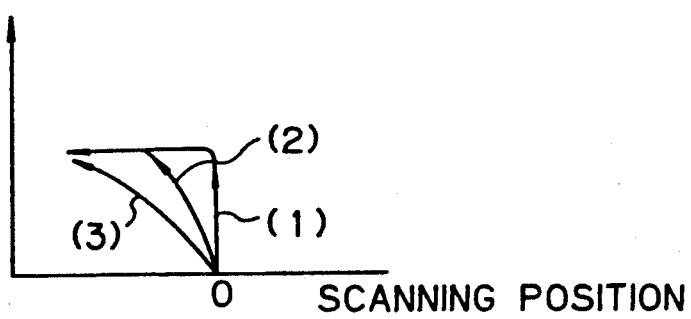

As shown in FIGS. 5A and 5B, the discriminating means 32 comprises a reference edge portion 33 and a secondary electron detector 34.

The operation of the discriminating means 32 of the present embodiment will be explained hereunder with reference to FIGS. 5A to 8.

As explained above, when the pattern configuration or area of the aperture of a block pattern changes, the amount of an electron beam B passing through a selected aperture of a block pattern is naturally changed, therefore the current value of the electron beam B irradiated on the sample wafer changes depending upon the pattern configuration used. Thus, when the exposure operation is carried out with the same exposure conditions, the electron beam B cannot be focused on the surface of the sample wafer with the best focus point or the width of the beam diffuses to cause the pattern edge formed on the sample wafer to lose sharpness, making the pattern diffused.

In the discriminating means 32, the reference edge portion 33 has a sharp edge 0 preferably formed at a right angle to a surface of the sample holding means 26. The secondary electron detector 34 detects the secondary electrons E emitted from the edge portion to which the electron beam B is irradiated.

In actual operation, an electron beam B having a rectangular cross-sectional configuration strikes a surface of a sample wafer 25 and is scanned back and forth along the surface thereof by the beam deflecting means 31. When the beam B crosses the edge 0 of the reference edge portion 33, the secondary electrons E are emitted from the reference edge portion 33. The amount of the secondary electrons E is detected by the secondary electron detector 34 to give a voltage curve as shown in FIG. 5(b).

According to the voltage curve as shown in FIG. 5(b), when the electron beam B is set at the best focus point on the sample wafer, a lot of secondary electrons are emitted, so when the electron beam B contacts to the edge 0 of the reference edge portion 33, a voltage curve (1) having a steep rising portion as shown in FIG. 5(b) is obtained. When the beam is not set at the best focus point but is diffused, the amount of the secondary electrons emitted from the reference edge portion 33 is rather smaller, so voltage curves (2) and (3) having inclined configurations are obtained.

Figure 6:
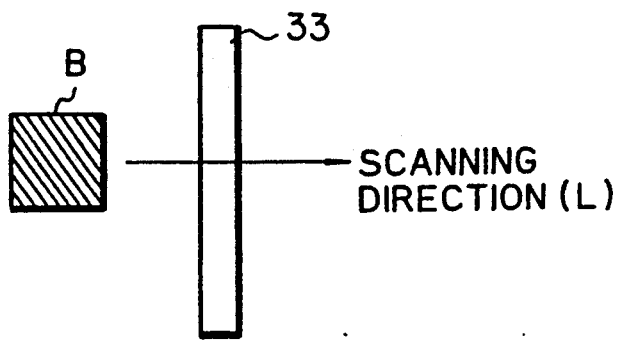
Figure 7A:
Figure 7B:
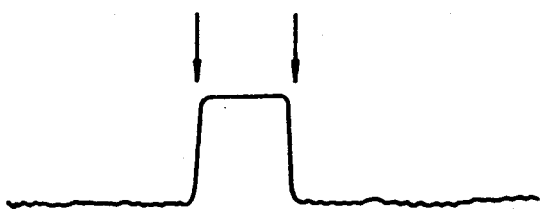

FIG. 6 is a plane view illustrating a scanning process of an electron beam B against the reference edge portion 33. In that figure, the electron beam B is scanned over the reference edge portion 33 in a scanning direction L as indicated. When the electron beam is focused on a sample wafer without setting the best focus point, a voltage curve as shown in FIG. 7a is obtained in response to a data detected by the secondary electron detector 34. When it is set at the best focus point, a voltage curve as shown in FIG. 7b is obtained.

Note that while the above explanation was made referring to an electron beam B having a rectangular cross-sectional configuration, any configuration may be used. An electron beam B having a rectangular cross-sectional configuration is preferably used, however, to obtain accurate data.

As explained above, it is apparent that when the electron beam B is focused on the surface of the sample wafer, the steepest voltage curve can be obtained. By repeating the beam scanning operation as explained above and changing the amount of current flowing through the focus adjusting coil 30 of the focus adjusting means 28 and observing the voltage curve obtained from each scanning operation, the best focus point can be determined.

Note, that in these scanning operations, when the steepest voltage curve is obtained, it can be determined that the electron beam is set at the best focus point. The amount of the current used at this occasion is memorized in a suitable memory, explained later.

FIG. 8 is a flow-chart indicating an algorithm to carry out an operation of the present invention by which the best focus point of the beam is discriminated.

First, at step a, an electron beam B having a rectangular cross-sectional configuration is scanned over a reference edge portion 33 in a direction L.

At step b, a voltage is detected by the secondary electron detector 34 and voltage waveform is output.

At step c, the variation of the voltage thus obtained is differentiated to obtain the peak values and then a peak-to-peak value (p-p) is calculated.

At step d, a decision is made whether the peak-to-peak value (p-p) thus obtained is maximum or not. If YES, this routine is finished; if NOT, the process goes to step e to change the focus point adjustment condition data, i.e., to change the amount of the current flowing through the focus adjusting coil 30, and the control then returns to step a and the same routine is repeated.

Figure 9:
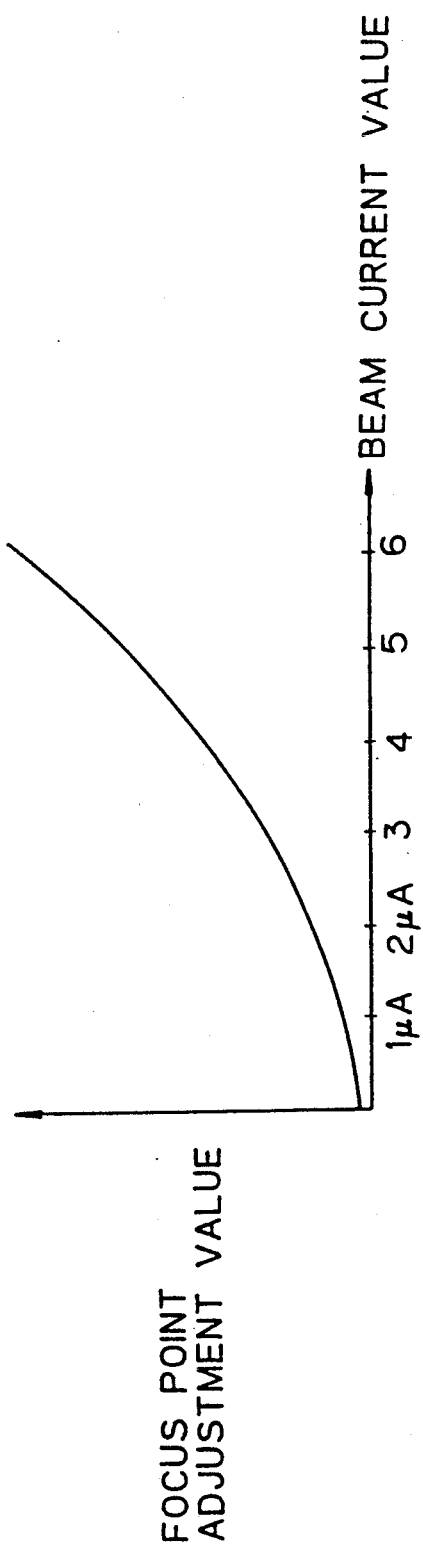
FIG. 9 is a graph indicating the relationship between an amount of an electric current and a focus adjusting value.

FIG. 9 shows the relationship between a necessary focus point adjustment value and the current flowing in the focus adjusting coil 30, as one of the focus adjustment condition data of the present invention.

As apparent from the graph shown in FIG. 9, the necessary focus point adjustment value has a positive correlation with the amount of the current. It is clear that when the necessary amount of the focus point adjustment value is large, a large amount of current is required and vice versa.

As explained above, when the focus point is adjusted by operating the focus adjusting means 28, the electron beam B is deviated from the center axis of the device, especially from the center axis of the focus adjusting means 28.

Thus, a beam axis deviation adjusting operation is required to form an accurate pattern on the surface of the sample wafer by deflecting the beam back to the center axis of the device to cancel the deviation.

Toward this end, it is apparent that a discriminating means is also required for determining whether a deviation between the beam and the center axis of the device exists and if such deviation exists, how far the beam is deviated from the center axis.

Such a discriminating means can be provided separately from the means for discriminating the best focus point as explained above, but in this embodiment a single such means is used.

When the best focus point is obtained in accordance with the discriminating operation as explained above, at least one of the steepest portions in the voltage curve, i.e., the curve portion indicating the position at which the rectangular beam B first contacts the edge 0 of the reference edge portion 33, shows the position of the axis of the beam B.

Therefore, after this position is memorized by, for example, X, Y coordinate data in a suitable memory, the deviation can be easily processed by a suitable processor by other X, Y coordinate data representing a position of the center axis of the device.

In this embodiment, when the data of the position representing the place at which the beam axis exists is memorized in a suitable memory means, information about the area of the rectangular cross-sectional aperture used is preferably memorized in the same memory means.

The focus point adjusting process of the present invention utilizing the electron beam exposure device as explained above will be explained hereunder.

The focus point adjusting process of the present invention comprises the following steps;

Step 1: Selecting one of the block patterns $P_l$ to $P_n$ provided on a mask plate 27 utilizing a mask pattern deflecting means 5 and 5' which is controlled by a mask deflection control circuit 103.

The mask deflector control circuit 103 is further controlled by a pattern control circuit 102 controlled by a microcomputer (CPU) 110 through an interface 108 and a data memory circuit 109. A beam deflecting means 9 is controlled by a beam deflecting means control circuit (DAC/AMP) 111. At this step, one of the block patterns $P_n$ (e.g., $P_l$) is selected.

Step 2: Deflecting the electron beam B so as to pass through an aperture of the selected block pattern $P_1$ to give the beam B the same cross-sectional configuration as that of the aperture and irradiating the beam on a surface of the sample wafer 25.

Step 3: Measuring an amount of the current $I_1$ flowing on the surface of the sample wafer, and generated by the charged particles composing the electron beam B striking the surface of the sample wafer, by the current detecting means 29. (In step 3, the area of the aperture of the block pattern may previously be measured or it may still be unknown.)

The measured current data $I_1$ is stored in a first memory means 120 connected to the pattern control circuit 102 with the information representing the pattern identification no., for example, $P_1$.

Step 4: Deflecting the electron beam B to the variable rectangular shape generating means R (FIG. 2) so as to pass through a rectangular aperture Q of the means R.

Step 5: Varying the area of the rectangular aperture of the variable rectangular shape generating means R by changing the overlap of two plates having rectangular apertures to obtain an electrical current IQ of the same amount as the electrical current $I_1$ obtained in step 3, measuring the current $I_Q$ in the same manner as in step 3.

In an actual process, the current i is continuously detected during the operation in which the area of the rectangular aperture of the block pattern is changed.

The current $I_Q$, which is the same current as obtained in the case utilizing a non-rectangular cross-sectional pattern $P_1$, and the area $S_1$ of the rectangular aperture Q by which the current $i_1$ is obtained are memorized in a memory means 120.

The beam which passes through the rectangular aperture having the area $S_1$ may be referred to as the beam $B_1$, as shown in FIG. 3 in memories 120, 121.

In step 5, any kind of electron beam B having a specific cross-sectional configuration of a block pattern having a certain area can be converted into a beam B having a cross-sectional configuration of an area the same as that of the beam formed by the pattern P having a specific cross-sectional configuration other than a rectangular configuration.

Step 6: Utilizing the beam $B_1$ thus obtained having a rectangular cross-sectional configuration with an area S the same as that of a beam B formed by passing through a block pattern $P_1$ having a non-rectangular cross-sectional aperture, the focus adjusting condition data $D_1$ is measured by the discriminating method as explained above.

The focus adjusting condition data $D_1$ thus obtained appears to correspond to the same data, as if measured utilizing the block pattern $P_1$.

In Step 6, as explained above, the beam $B_1$ is repeatedly scanned varying the current I supplied to the focus adjusting means 28. In the discriminating means 32, the discriminating operation is continued until the voltage curve (1) having the steepest raising portion is obtained; thereafter, the control current $I_1$ is supplied to the focus adjusting means 28. The voltage curve having the steepest raising portion is obtained and stored in a memory means 120 as the focus adjusting condition data $D_1$.

In the same manner, utilizing the beam $B_2$, $B_3$... each having a cross-sectional configuration of an area the same as that of the beam formed by the pattern $P_2$, $P_3$... each having a specific cross-sectional configuration other than a rectangular configuration, the current $I_2$, $I_3$... is obtained respectively in the same manner as explained above. Finally, each current $I_2$, $I_3$... is stored in a memory means 120 as the focus adjusting condition data $D_2$, $D_3$....

Step 7: Finally, the pattern configurations $P_l$ to $P_n$ and the respective focus adjusting condition data $D_l$ to $D_n$, which are required when the respective patterns $P_l$ to $P_n$ are used, are stored as a pair respectively in the address memorizing portion TB and in the related data memorizing region of the first memory means 120 to form a first table.

When information about the patterns is stored in the memory means 120, the configuration of the pattern per se may be stored therein or a certain kind of identification number or symbol representing each of the patterns may be stored in the memory means.

In FIG. 3, a memorizing condition of one example of the present invention is illustrated in which the address memorizing region TB is given address portions $\#P_l$ to $\#P_n$ corresponding to the respective block pattern $P_l$ to $P_n$, and the respective focus adjusting condition data $D_l$ to $D_n$ are stored in the respectively addressed data memorizing portions.

The actual operation of the electron beam exposure device of the present invention will be explained hereunder.

As shown in FIG. 3, when a desired block pattern $P_1$ is selected, a certain command signal is issued from the CPU 110 to the pattern control circuit 102, then the circuit 102 generates a control signal to the mask deflection control circuit 103 to deflect the beam B to the desired pattern $P_1$ by controlling the deflecting means 5 and 5'.

Simultaneously, a command ordering that the pattern $P_1$ be selected is transferred to the memory circuit 120 from the pattern control circuit 102.

The address $\#P_1$ corresponding to the selected block pattern $P_1$ is confirmed and successively in accordance with the address $\#P_1$, the focus adjusting condition data $D_1$ stored in the corresponding data portion for the address portion $\#P_1$ of TB is read out from the data storing region, then transferred to the focus point adjusting control circuit 100 including a digital-to-analog converter (DAC/AMP) 100a to operate the focus point adjusting means 28.

The focus point adjusting current $I_1$ corresponding to the focus point adjusting condition $D_1$ stored in the lookup table in the first memory means 120 is supplied to the focus point adjusting coil 30 to set the focus point at the best focus point as desired.

After the focus point is set at the best focus point, the exposure operation is carried out to irradiate the beam B on the surface of the wafer 25.

In FIG. 3, the deflection control circuit 106 is also used in the process for detecting the best focus point and measuring the focus adjusting condition data.

In FIG. 3, a blanking circuit 112 is provided. The blanking circuit 112 controls a beam blanking means 13 so as to block beam passage during a time when a focus point should be moved from one place already exposed by the beam to a next place to be exposed by the beam.

In the present embodiment as explained above, the focus adjusting condition data is stored in the first memory means 120 as current values $I_l$... $I_n$ since the focus adjusting means 28 works by the coil 30 operated by current. When the focus adjusting means 28 works with a factor other than current, the focus adjusting condition data may be stored in the memory means in a form of another factor proportional to the current.

In this embodiment, the area of the cross-sectional configuration of each block pattern $P_l$ to $P_n$ is converted to a rectangular cross-sectional pattern having the same area of each of the block patterns $P_l$ to $P_n$ by measuring the current I and adjusting the area of the variable rectangular shape generating means so as to obtain the same amount of current as obtained when the selected block pattern is used.

But in the present invention, when the area of each of the block patterns $P_l$ to $P_n$ can be directly converted to a rectangular cross-sectional pattern having the same area of each of the block patterns $P_l$ to $P_n$ with a certain function, for example, some mathematical equation, representing some relationship between the area of each block pattern and that of the pattern formed by the optional rectangular shape generating means, the rectangular cross-sectional configuration corresponding to that of each one of the block patterns $P_l$ to $P_n$ can be obtained more simply than the previously mentioned method.

As explained above, in the present invention, there is another problem that the electron beam is sometimes deviated from a center axis of the electron beam exposure device, especially a focus adjusting means and beam deflecting means.

Accordingly, it is necessary to correct this deviation by deflecting back the deviated beam back to the center axis. There is therefore provided a beam axis deviation adjusting means as explained above. One example of the correction of such deviation will be explained hereunder.

Here, the beam axis deviation adjusting means is combined with the beam deflecting means 31 and works with the current detecting means 29.

The operation of the beam axis adjusting method of the present embodiment comprises; steps 1 to 5 of the process for obtaining the focus adjusting condition data as explained above and an additional steps 6 and 7 as follows:

Step 6: utilizing the beam $B_1$, having a rectangular cross-sectional configuration of an area S the same as that of a block pattern $P_1$ having a non-rectangular cross-sectional aperture, measuring the beam axis deviation adjusting data ID, by the axis deviation discriminating means 32 (in this embodiment, the discriminating means for detecting the focus point adjusting condition data also has the function for detecting the beam axis deviation) by the method as explained above.

The beam axis deviation adjusting data $ID_1$ corresponds to the same data which would be measured by the same method utilizing the block pattern $P_1$.

In step 6, as explained above, the beam $B_1$ is repeatedly scanned varying the current I supplied to the focus adjusting means 28 and the discriminating operation is continued until the voltage curve (1) having the steepest raising portion therein is obtained. Thereafter, the control current $I_1$ is supplied to the focus point adjusting means 28, whereby the voltage curve having the steepest raising portion is stored in a memory means 120 as the focus adjusting condition data $D_1$.

As explained above, the beam axis deviation adjusting data ID is represented by the position in the voltage waveform where the steepest curve is obtained. Therefore, when the position thereof is memorized in the form of, for example, X-Y coordinate data in the memory means 121 and the position data of the center axis of the device is also stored in the memory means 121 in a form of X-Y coordinate data, the amount of a deviation thereof can be easily processed and determined.

And thus, the beam axis deviation adjusting data ID indicating a corresponding deviation which would be obtained if the block pattern $P_1$ is used can be obtained.

In order to deflect the deviated beam again to move back to the center axis of the device, a certain amount of a current I or a voltage is supplied from the pattern control circuit 102 to the beam deflection control circuit 106.

Practically, the beam axis deviation adjusting means is included in the pattern control circuit 102 and detects and measures continuously the deviation thereof by changing the supplied current or voltage to the beam deflection control circuit 106.

When the deviation thereof thus detected is a minimum value, preferably zero, it is decided that the deviation is eliminated and the operation is stopped. The amount of the current $I_1$ whereby the deviation thereof is corrected for the pattern $P_1$ is stored, in the data memorizing region corresponding to the address $\#P_1$ of region TB in the second memory means 121, as the beam axis deviation adjusting data.

Note, that in the memory means 121, the current data, i.e., beam axis deviation adjusting data $ID_1$, and the address $\#P_1$ are stored as a pair.

As the same manner, utilizing the beams $B_2$, $B_3$... each having a rectangular cross-sectional configuration of an area the same as that of the beams formed by the pattern $P_2$, $P_3$... each having a specific cross-sectional configuration other than a rectangular configuration respectively, the beam axis deviation adjusting data $ID_2$, $ID_3$... is obtained in the same manner as explained above and finally each beam axis deviation adjusting data $ID_2$, $ID_3$... is stored in the second memory means 121. Step 7: Finally, the address memorizing region TB is given address portions $\#P_l$ to $\#P_n$ corresponding to the respective block patterns $P_l$ to $P_n$ and the corresponding beam axis deviation adjusting data $ID_l$ to $ID_n$ is stored in the respective, individually addressed portions of the data memorizing regions in the memory means 121 to form a second table.

In actual operation, when the beam axis deviation adjusting means detects beam axis deviation with using the block pattern $P_l$, for example, the beam axis deviation adjusting means first recognizes that the block pattern used is $P_l$ and then a beam axis deviation adjusting data $ID_l$, stored in memory 121 for the address $\#P_l$ corresponding to the block pattern $P_l$, is read out from the second memory means 121 through the pattern control circuit 102 and supplied to the beam deflection circuit 106 including a D/A converter to deflect the beam back to the center axis of the device.

After the beam axis deviation is adjusted, the exposure operation is carried out to irradiate the beam B on the surface of the wafer 25.

In the present embodiment as explained above, the focus point adjusting process and the beam axis deviation adjusting process are carried out separately, but these processes can be carried out simultaneously in one process.

Since as explained above, the axis deviation of the electron beam is mainly caused by the focus point adjusting process, the beam axis deviation adjusting process may be carried out just after the focus point adjusting process.

One example of a process flow in which both the focus point adjusting process and beam axis deviation adjusting process are simultaneously carried out is shown in the composite of FIGS. 10A and 10B.

According to the present invention, no matter what block pattern is selected, the best exposure condition can be obtained since the focus adjusting condition data and the beam axis deviation adjusting data, both of which are necessary for setting the focus point of the beam formed by a selected block pattern on a sample wafer in the best condition, are previously stored in a memory means, the adjusting data as mentioned above is read out from the memory means in response to the selected pattern and supplied to one of the focus point adjusting means and the beam axis deviation adjusting means, and thereby the focus point thereof is suitably adjusted to be the best in response to the adjusting data thus supplied to obtain a fine and clear pattern image on the wafer efficiently.

We claim:

1. An electron beam exposure device having a center axis and comprising:

an electron gun, a mask plate provided with a plurality of apertures configured in accordance with a plurality of respective patterns, each pattern aperture having a specific shape, for forming a corresponding cross-sectional shape of an electron beam composed of charged particles when selectively irradiated thereon, deflecting means provided both on a first side of said mask plate onto which said beam is irradiated and on a second side thereof from which said beam is emitted, for deflecting said beam from an original axis thereof so as to pass through a selected one of said apertures provided on said mask plate, and for deflecting again said beam after passing through said selected aperture so as to return said beam to said original axis thereof, a sample holding means for holding a sample, a focus point adjusting means provided between said mask plate and sample holding means, and a control means for controlling said focus point adjusting means, wherein said focus point adjusting means further comprises processing means for processing focus point adjusting condition data associated with each pattern utilizing a predetermined relationship between the cross-sectional area of the aperture of each pattern, as selected for use in an exposure, and a specific focus point adjusting value with respect to each said selected and used pattern, and supplying means for supplying information of said focus point adjusting condition data thus obtained to said focus point adjusting means.

2. An electron beam exposure device according to claim 1, wherein said control means further comprises memory means for storing data of said predetermined focus point adjusting condition data in accordance with the shape of the aperture of each pattern provided on said mask plate and selecting means for selecting at least one of said predetermined focus point adjusting condition data from said memory means in accordance with one of the shape of the aperture of a selected pattern and an identification number representing said shape of said aperture of said selected pattern.

3. An electron beam exposure device according to claim 2, wherein said focus point adjusting means further comprises measuring means for measuring the cross-sectional area of the aperture defining the shape of each pattern provided on said mask plate, a cross-sectional area adjusting means for adjusting a variable rectangular shaped aperture generating means to make the cross-sectional area of said rectangular shaped aperture, generated thereby, coincide with said measured cross-sectional area of the aperture of each pattern, processing means for processing and determining said focus point adjusting condition data with respect to said rectangular shaped aperture made by said variable rectangular shaped aperture generating means and having a cross-sectional area corresponding to that of said aperture of a respective said pattern, for all of said patterns provided on said mask plate, and transferring means for transferring said focus point adjusting condition data thus obtained to said memory means.

4. An electron beam exposure device according to claim 1, wherein said control means further comprises means for processing a function representing a relationship between the cross-sectional area of the aperture of each pattern on said mask plate and the respective focus point adjusting condition data, for each pattern provided on the mask and as selected for use in an exposure.

5. An electron beam exposure device according to claim 3, wherein said memory means further comprises a table containing said information of said plurality of pattern apertures having respective shapes, as provided on said mask plate, or identification symbols thereof, and said focus point adjusting condition data required for each one of said pattern apertures provided on the mask and selectable for use in an exposure.

6. An electron beam exposure device according to claim 3, wherein said focus point adjusting means further comprises discriminating means for determining whether the focus point of a beam, as set on a sample held on said sample holding means, is at a best focus point or not.

7. An electron beam exposure device according to claim 3, wherein said focus point adjusting means further comprises discriminating means for determining an amount of a deviation of said beam from the center axis of said device.

8. An electron beam exposure device which comprises an electron gun, a mask plate provided with a plurality of apertures configured in accordance with a plurality of patterns, each having a specific shape and forming a corresponding cross-sectional shape of an electron beam composed of charged particles when selectively irradiated thereon, deflecting means provided both on a first side of a mask plate onto which said beam is irradiated and on a second side thereof from which said beam is emitted, for deflecting said beam from an original axis thereof so as to pass through a selected one of said apertures, and for deflecting again said beam after passing through the selected aperture so as to return said beam to said original axis thereof, sample holding means, a focus point adjusting means for refocussing said electron beam in accordance with the selected pattern, beam axis deviation adjusting means for adjusting deviation of said beam from a center axis of said deflecting means and thereby to make the beam coincide with said center axis of said focus point adjusting means, and control means for controlling said beam axis deviation adjusting means.

9. An electron beam exposure device having a center axis and comprising;

an electron gun, a mask plate provided with a plurality of apertures configured in accordance with a plurality of patterns, each having a specific shape, for forming a corresponding cross-sectional shape of an electron beam composed of charged particles when selectively irradiated thereon, deflecting means provided both on a first side of said mask plate onto which said beam is irradiated and on a second side thereof from which said beam is emitted, for deflecting said beam from an original axis thereof so as to pass through a selected one of said apertures provided on said mask plate, and for deflecting again said beam after passing through the selected aperture so as to return said beam to said original axis thereof, sample holding means, focus point adjusting means provided between said mask plate and said sample holding means, and control means for controlling said focus point adjusting means, wherein said focus point adjusting means further comprises processing means for processing focus point adjusting condition data associated with each pattern having a specific shaped aperture utilizing a specific relationship between the cross-sectional area of the aperture of each pattern as selected for use in an exposure and a specific focus point adjusting value with respect to each of said patterns, supplying means for supplying information of said focus point adjusting condition thus obtained to said focus point adjusting means, and beam axis deviation adjusting means for measuring a deviation of said beam relative to said center axis of said device and adjusting the beam in accordance with the measured deviation to cause the beam to coincide with said center axis of said device.

10. An electron beam exposure device according to claim 8, wherein said control means for controlling said beam axis deviation adjusting means further comprises memory means for storing predetermined adjusting data for adjusting said deviation, measuring means for measuring said deviation from said center axis of said device, and processing means for processing said measured deviation data with stored adjusting data to generate control data used for said adjustment of said beam by said beam axis deviation adjusting means.

11. An electron beam exposure device according to claim 9, wherein said beam axis deviation adjusting means further comprises processing means for processing said measured deviation data to generate control data for adjusting said deviation of said beam, taking into account said focus point adjusting condition data determined by said focus point adjusting means, for each of said plurality of pattern apertures.

12. An electron beam exposure device according to claim 9, wherein said device further comprises at least a first memory means for storing information about said axis deviation adjusting data with respect to each of said patterns and a second memory means for storing information about said focus point adjusting data with respect to each of said patterns.

13. A method for adjusting a focus point in an electron beam exposure device having a center axis and which comprises an electron gun, a mask plate provided with a plurality of apertures each having a specific shape for forming a corresponding cross-sectional shape of an electron beam composed of charged particles when selectively irradiated thereon and a variable rectangular aperture forming means by which the cross-sectional area of a rectangular aperture formed thereby is variably changed, deflecting means provided both on a first side of said mask plate onto which said beam is irradiated and on a second side thereof from which said beam is emitted, for deflecting said beam from an original axis thereof so as to pass through a selected one of said apertures of said patterns provided on said mask plate and for deflecting the beam again to return to said original axis thereof, respectively, sample holding means for holding a sample, current measuring means for measuring the current flowing through a surface of said sample when irradiated by said electron beam, and focus point adjusting means including memory means for storing control data thereof and control means for controlling said focus point adjusting means, said method comprising the steps of:

selecting one of the patterns having a certain cross-sectional shape and a certain area, as provided on said mask plate;

irradiating a beam through said selected pattern to form an image of said pattern on a surface of a sample held on said sample holding means;

measuring a current value produced by and representing the intensity of said beam when irradiated on said surface of said sample held on said sample holding means, with respect to each said selected pattern;

storing said current values in memory means;

adjusting the cross-sectional area of a rectangular shaped aperture of variable cross-sectional area so as to produce the same current as that obtained when one of said patterns is selected by measuring the amount of said current and correspondingly adjusting said variable cross-sectional area of said rectangular shaped aperture thereby to conform to said cross-sectional area of the respective, selected pattern, for all said patterns;

determining focus point adjusting condition data thereby to adjust said beam to a best focus point by said focus point adjusting means, by utilizing discriminating means for determining whether said focus point is suitably located at the best focus point or not and, if not, processing said focus point adjusting condition data to determine said best focus point;

storing said data thus obtained in said memory means of said control means; and adjusting said focus point by operating said focus point adjusting means in response to said focus point adjusting condition data stored in said memory means.

14. A method for adjusting a focus point in an electron beam exposure device according to claim 13, wherein said steps further comprise:

storing in said memory means a plurality of said focus point adjusting condition data obtained by measuring the same for each of the respective patterns provided on said mask pattern, and selecting, in response to a pattern selected for use or pattern information corresponding to a pattern selected for use, the respectively corresponding focus point adjusting condition data stored in said memory.

15. A method for adjusting a focus point in an electron beam exposure device according to claim 14, wherein said focus point adjusting condition data thus obtained with respect to a selected pattern of said mask plate are stored with information corresponding to said selected pattern in a respective, specific address portion of a table portion of said memory means.

16. A method for adjusting a beam axis deviation of an electron beam in an electron beam exposure device, which device has a center axis and comprises an electron gun, a mask plate provided with a plurality of apertures each having a specific shape, for forming respectively corresponding cross-sectional shapes of said electron beam when selectively and respectively irradiated thereon, deflecting means provided both on a first side of said mask plate onto which said beam is irradiated and on a second side thereof from which said beam is emitted, for deflecting said beam from an original axis thereof so as to pass through a selected one of said apertures of said patterns provided on said mask plate and for deflecting said beam again to return to said original axis thereof, respectively, sample holding means, current measuring means for measuring the current flowing through a surface of a sample held by said sample holding means so as to be exposed by said electron beam, beam axis deviation adjusting means, and control means for controlling said beam axis deviation adjusting means and including a memory means, said method comprising the steps of:

measuring a beam axis deviation formed between said beam and said center axis of said device;

determining control data for adjusting said deviation to make said beam coincide with said center axis of said device;

supplying said control data to said beam axis deviation adjusting means; and adjusting said deviation by said beam axis deviation adjusting means in response to said control data thus determined and supplied thereto.

17. The method of claim 16 for further adjusting the focus point of the electron beam and wherein said electron beam exposure device further comprises a focus point adjusting means, the method further comprising:

storing a plurality of focus point adjusting condition data for adjusting the focus point of said beam, as thus obtained respectively for the plurality of patterns selectable for use in an exposure, in said memory means and selecting the respective said focus point adjusting condition data from said memory means, in response to the pattern selected for use or pattern information corresponding to the pattern selected for use, as input to said focus point adjusting means.

18. The method according to claim 16, wherein said beam axis deviation data thus obtained with respect to a selected pattern of said mask plate are stored with said information corresponding to said selected pattern in a respective, specific address portion of a table portion of said memory means.

19. A method for adjusting at least one of a focus point and a beam axis deviation of a charged particle beam of a charged particle beam exposure device, which device has a center axis and comprises an electron gun, a mask plate provided with a plurality of apertures each having a specific shape, for forming respectively corresponding cross-sectional shapes of said charged particle beam when selectively and respectively irradiated thereon, deflecting means provided both on a first side of said mask plate onto which said beam is irradiated and on a second side thereof from which said beam is emitted, for deflecting said beam from an original axis thereof so as to pass through a selected one of said apertures of said patterns provided on said mask plate and for deflecting the beam again to return to said original axis thereof, a sample holding means, current measuring means for measuring the current flowing through a surface of a sample held by said sample holding means so as to be exposed by said electron beam, a focus point adjusting means, a beam axis deviation adjusting means and a control means for controlling at least a selected one of said focus point adjusting means and said beam axis deviation adjusting means and including at least one memory means therein for storing control data to adjust the selected one of the focus point and the beam axis deviation of the beam, said method comprising:

selecting, individually and successively, patterns having respective, specific shapes and corresponding cross-sectional areas and provided on said mask plate;

irradiating the beam through each of said patterns, as thus individually and successively selected, to form corresponding images of said patterns on said surface of said sample held on said sample holding means; and for each selected pattern:

measuring the current value, representing the intensity of said beam, flowing through said irradiated surface of said sample held on said sample holding means, selecting a rectangular shaped aperture having a cross-sectional area giving the same amount of current as that obtained for the selected pattern, by measuring the value of said current when irradiating said surface of said sample through the rectangular shaped aperture and adjusting said cross-sectional area of said rectangular shaped aperture until said current value conforms with that of said selected pattern, determining focus point adjusting condition data required to adjust the beam to a best focus point by said focus point adjusting means utilizing discriminating means for determining whether said focus is suitably located at the best focus point or not and, if not, processing said focus point adjusting condition data to achieve said best focus point, storing said focus point adjusting condition data in said memory means of said control means with a suitable address corresponding to the respective, selected pattern, adjusting said focus point by operating said focus point adjusting means in response to said focus point adjusting condition data stored in said memory means, measuring a beam axis deviation formed between an axis of said focus point adjusting means and said beam, determining control data for adjusting said deviation to make said beam coincide with said axis of said focus point adjusting means, storing said beam axis deviation adjusting data thus obtained in said memory means of said control means with a suitable address corresponding to the respective, selected pattern, reading said respective stored beam axis deviation adjusting data for said selected pattern from said memory in accordance with the address thereof and supplying same to said beam axis deviation adjusting means, and adjusting said deviation by said beam axis deviation adjusting means in response to said beam axis deviation adjusting data, as stored in and read from said memory means and supplied thereto, for said selected pattern.

20. A method for adjusting a focus point in an electron beam exposure device according to claim 19, wherein said focus point adjusting condition data and said beam axis deviation data for each selected pattern are stored in respective, separate tables of said memory means with said information corresponding to said selected pattern in a corresponding, specific address portion of said tables of said memory means.

21. A method for adjusting a focus point in an electron beam exposure device according to claim 15, wherein when one of said patterns provided on said mask plate is selected, said control means reads out the respective focus point adjusting condition data stored in said corresponding, specific address portion of said memory means for said selected pattern and supplies said focus point adjusting condition date, as read out thereby, to said focus point adjusting means.

22. A method for adjusting a focus point in an electron beam exposure device according to claim 21, wherein, when one of said apertures of said patterns provided on said mask plate is selected, said control means, further, reads out the respective beam axis deviation data stored in said corresponding, specific address portion of said memory means for said selected pattern and supplies said beam axis deviation data, as read out thereby, to said beam axis deviation adjusting means.

23. A method for exposing an electron beam on a surface of a sample held on a sample holding means utilizing an electron beam exposure device comprising an electron gun, a mask plate provided with a plurality of apertures defining corresponding patterns, each pattern aperture having a specific shape and forming a corresponding cross-sectional shape of an electron beam composed of charged particles when selectively irradiated thereon, deflecting means provided both on a first side of said mask plate onto which said beam is irradiated and on a second side thereof from which said beam is emitted for deflecting said beam from an original axis thereof so as to pass onto and through a selected one of said apertures and for deflecting again said beam so as to return to said original axis thereof, sample holding means, focus point adjusting means provided between said mask plate and said sample holding means, and control means for controlling said focus point adjusting means and including memory means, comprising the steps of:
  selecting one of the patterns having an aperture of a respective specific shape and specific cross-sectional area;
  irradiating a beam through the aperture of said pattern as thus selected, thereby to form an image of said selected pattern on said sample holding means;
  measuring the current value, representing the intensity of said beam, flowing through said irradiated surface of said sample held on said sample holding means with respect to said pattern thus selected;
  storing said current value in said memory means;
  selecting a rectangular shaped aperture having a cross-sectional area giving the same current value as that obtained for said selected pattern by measuring the value of said current when irradiating said surface of said sample through the rectangular shaped aperture and adjusting said cross-sectional area of said rectangular shaped aperture until said current value conforms with that of said selected pattern;
  determining focus point adjusting condition data required to adjust the beam to a best focus point by said focus point adjusting means utilizing a discriminating means for determining whether said focus of said beam is suitably located at the best focus point or not and, if not, processing said focus point adjusting condition data to achieve said best focus point;
  storing said focus point adjusting condition data in said memory means;
  adjusting the focus point of said beam by operating said focus point adjusting means in response to said focus point adjusting condition data stored in said memory means; and
  exposing said electron beam onto the surface of a sample held on said sample holding means through said selected pattern and as thus adjusted for the selected pattern to form an image of said selected pattern thereon.

24. A method for exposing an electron beam on a surface of a sample held on a sample holding means utilizing an electron beam exposure device, the device having a center axis and comprising an electron gun, a mask plate provided with a plurality of apertures defining corresponding patterns, each pattern aperture having a specific shape and forming a corresponding cross-sectional shape of an electron beam composed of charged particles selectively irradiated thereon, deflecting means provided both on a first side of said mask plate onto which said beam is irradiated and on a second side thereof from which said beam is emitted for deflecting said beam from an original axis thereof so as to pass onto and through a selected one of said apertures and for deflecting again said beam so as to return to said original axis thereof, sample holding means, beam axis deviation detecting and adjusting means provided between said mask plate and said sample holding means, and control means for controlling said beam axis deviation adjusting means and including memory means, comprising the steps of:
  selecting one of the patterns having an aperture of a respective, specific shape and cross-sectional area;
  irradiating a beam through the aperture of said pattern as thus selected, thereby to form an image of said selected pattern on the surface of a sample held by said sample holding means;
  measuring the current value, representing the intensity of said beam flowing through said irradiated surface of said sample with respect to said pattern thus selected;
  selecting a rectangular shaped aperture having a cross-sectional area giving the same current value as that obtained for said selected pattern by measuring the value of current when irradiating said surface of said sample through the rectangular shaped aperture and adjusting said cross-sectional area of said rectangular shaped aperture until said current value conforms with that of said selected pattern;
  determining beam axis deviation of said beam from said center axis of said device and generating beam axis deviation adjusting data required to adjust said beam axis to coincide with said center axis of said device by utilizing said beam axis deviation detecting means;
  storing said beam axis deviation adjusting data in said memory means;
  adjusting said beam axis deviation to coincide with said center axis of said device by operating said beam axis deviation adjusting means in response to said beam axis deviation adjusting data stored in said memory means; and
  exposing said electron beam onto the surface of a sample held on said sample holding means through said selected pattern and as thus adjusted for the selected pattern to form an image of said selected pattern thereon.

25. A method for exposing an electron beam onto a surface of a sample held by sample holding means, utilizing an electron beam exposure device, the device having a center axis and comprising an electron gun, a mask plate provided with a plurality of apertures defining corresponding patterns, each pattern aperture having a specific shape and forming a corresponding cross-sectional area of an electron beam composed of charged particles selectively irradiated thereon, deflecting means provided both on a first side of said mask plate onto which said beam is irradiated and on a second side thereof from which said beam is emitted for deflecting said beam from an original axis thereof so as to pass onto and through a selected one of said apertures and for deflecting again said beam so as to return to said original axis thereof, sample holding means, focus point adjusting means provided between said mask plate and said sample holding means, control means for controlling said focus point adjusting means and including first memory means for storing focus point adjusting data therein, beam axis deviation detecting and adjusting means provided between said mask plate and said sample holding means, and said control means further controlling said beam axis deviation adjusting means and including second memory means for storing beam axis deviation adjusting data therein, comprising the steps of:

selecting one of the patterns having an aperture of a respective, specific shape and cross-sectional area;

irradiating a beam through the aperture of said pattern as thus selected, thereby to form an image of said selected pattern on the surface of a sample held on said sample holding means;

measuring the current value, representing the intensity of said beam, flowing through said irradiated surface of said sample held on said sample holding means with respect to said pattern thus selected;

storing said current value in said first memory means;

selecting a rectangular shaped aperture having a cross-sectional area giving the same current value as that obtained for said selected pattern by measuring the value of current when irradiating said surface of said sample through the rectangular shaped aperture and adjusting said cross-sectional area of said rectangular shaped aperture until said current value conforms with that of said selected pattern;

determining focus point adjusting condition data required to adjust the beam to a best focus point by said focus point adjusting means utilizing a discriminating means for determining whether said focus on said beam is suitably located at the best focus point or not and, if not, processing said focus point adjusting condition data to achieve said best focus point;

storing said focus point adjusting condition data in said first memory means;

adjusting the focus point of said beam by operating said focus point adjusting means in response to said focus point adjusting condition data stored in said first memory means;

determining a beam axis deviation of said beam from said center axis of said device with respect to each selected pattern and generating beam axis deviation adjusting data required to adjust said beam axis to coincide with said center axis of said device by utilizing said beam axis deviation detecting means;

storing said beam axis deviation adjusting data in said second memory means;

adjusting said beam axis deviation to coincide with said center axis of said device by operating said beam axis deviation adjusting means in response to said beam axis deviation adjusting data stored in said second memory means; and irradiating an electron beam onto the surface of a sample held on said sample holding means through a selected pattern and as thus adjusted for the selected pattern to form an image of said selected pattern thereon.

* * * * *

UNITED STATES PATENT AND TRADEMARK OFFICE
CERTIFICATE OF CORRECTION

PATENT NO. : 5,148,033
DATED : September 15, 1992
INVENTOR(S) : Akio YAMADA et al.

It is certified that error appears in the above-indentified patent and that said Letters Patent is hereby corrected as shown below:

Col. 2, line 45, change "changed" to --change--.

Col. 3, line 49, change "the mask" to --the surface of the mask--.

Col. 5, line 57, change "10"" to --10'--.

Col. 12, line 36, change "with" to --when--.

Col. 19, line 5, change "date" to --data--.

Signed and Sealed this

Twenty-fourth Day of May, 1994

Attest:

BRUCE LEHMAN

Attesting Officer    Commissioner of Patents and Trademarks